(12) United States Patent
Cheng et al.

(10) Patent No.: US 8,703,552 B2
(45) Date of Patent: Apr. 22, 2014

(54) METHOD AND STRUCTURE FOR FORMING CAPACITORS AND MEMORY DEVICES ON SEMICONDUCTOR-ON-INSULATOR (SOI) SUBSTRATES

(75) Inventors: Kangguo Cheng, Guilderland, NY (US); Ramachandra Divakaruni, Ossining, NY (US)

(73) Assignee: International Business Machines Corporation, Armonk, NY (US)

(*) Notice: Subject to any disclaimer, the term of this patent is extended or adjusted under 35 U.S.C. 154(b) by 210 days.

(21) Appl. No.: 13/419,624

(22) Filed: Mar. 14, 2012

(65) Prior Publication Data

US 2012/0171821 A1    Jul. 5, 2012

Related U.S. Application Data

(62) Division of application No. 12/686,403, filed on Jan. 13, 2010, now Pat. No. 8,159,015.

(51) Int. Cl.
*H01L 27/06* (2006.01)
*H01L 21/8242* (2006.01)

(52) U.S. Cl.
USPC ........... 438/155; 438/243; 438/386; 438/250; 438/393; 438/302; 257/300; 257/301; 257/360; 257/E21.646; 257/E27.016

(58) Field of Classification Search
USPC ............... 438/155, 243, 386, 250, 393, 302; 257/300–302, E21.646, E27.016, 360
See application file for complete search history.

(56) References Cited

U.S. PATENT DOCUMENTS

| | | | |
|---|---|---|---|
| 6,429,068 B1 * | 8/2002 | Divakaruni et al. | 438/243 |
| 6,638,814 B1 * | 10/2003 | Kieslich et al. | 438/246 |
| 2008/0111154 A1 * | 5/2008 | Voldman | 257/192 |

* cited by examiner

*Primary Examiner* — Cathy N Lam
(74) *Attorney, Agent, or Firm* — Scully, Scott, Murphy & Presser, P.C.; H. Daniel Schnurmann (57) ABSTRACT

A device is provided that includes memory, logic and capacitor structures on a semiconductor-on-insulator (SOI) substrate. In one embodiment, the device includes a semiconductor-on-insulator (SOI) substrate having a memory region and a logic region. Trench capacitors are present in the memory region and the logic region, wherein each of the trench capacitors is structurally identical. A first transistor is present in the memory region in electrical communication with a first electrode of at least one trench capacitor that is present in the memory region. A second transistor is present in the logic region that is physically separated from the trench capacitors by insulating material. In some embodiments, the trench capacitors that are present in the logic region include decoupling capacitors and inactive capacitors. A method for forming the aforementioned device is also provided.

20 Claims, 6 Drawing Sheets

METHOD AND STRUCTURE FOR FORMING CAPACITORS AND MEMORY DEVICES ON SEMICONDUCTOR-ON-INSULATOR (SOI) SUBSTRATES

CROSS REFERENCE TO RELATED APPLICATION

This application is a divisional of U.S. patent application Ser. No. 12/686,403, filed Jan. 13, 2010 the entire content and disclosure of which is incorporated herein by reference.

BACKGROUND

The present disclosure relates generally to semiconductor devices. More particularly, the present disclosure relates to integrating memory, logic and capacitor structures in a single semiconductor substrate.

Semiconductor-on-insulator (SOI) devices offer several advantages over more conventional semiconductor devices. Currently, integrated circuits (IC)s may be provided including dynamic random access memory (DRAM) memory devices present on semiconductor-on-insulator (SOI) substrates, and logic devices, such as complementary metal-oxide semiconductor (CMOS), present on semiconductor-on-insulator (SOI) substrates. Further, on-chip capacitors have been increasing relied upon to maintain the functionality of high frequency integrated circuits. In order to be able to make integrated circuits (ICs), such as memory, logic, and other devices, of higher integration density than currently feasible, process commonality in the manufacturing of the memory devices, logic devices and on-chip capacitors favors the development of single chip integration.

SUMMARY

A method of fabricating a device is provided in which on-chip capacitors and memory devices are integrated onto the same semiconductor-on-insulator (SOI) substrate using a common trench capacitor process. In one embodiment, the method includes providing a substrate having a first semiconductor layer that is separated from a second semiconductor layer by an insulating layer present therebetween, in which the substrate includes a memory region and a logic region. Trench capacitors are formed in each of the logic region and the memory region, wherein each of the trench capacitors are produced using a same process sequence. Each trench capacitor extends from a surface of the first semiconductor layer through the insulating layer into the second semiconductor layer, in which each of the trench capacitors includes a first and second electrode separated by a node dielectric. Isolation regions may be formed in the first semiconductor layer. The isolation regions formed in the memory region are positioned to provide at least one first semiconductor island in contact with a first electrode of at least one trench capacitor. The isolation regions formed in the logic region provide at least one second semiconductor island that is separated from the trench capacitors. A first transistor is formed on the first semiconductor island and a second transistor is formed on the second semiconductor island. The first transistor is in electrical communication with at least one trench capacitor that is in contact with the first semiconductor island. Contacts are formed to the second electrode of the trench capacitor that is in the memory region, and to the first and second electrodes of at least one of the trench capacitors that are in the logic region.

In another aspect, a device is provided in which trench capacitors, logic devices, and memory devices are integrated onto the same semiconductor-on-insulator (SOI) substrate, wherein each of the trench capacitors are structurally the same. In one embodiment, a device is provided including a semiconductor on insulating (SOI) substrate having a memory region and a logic region. Trench capacitors are present in the memory region and the logic region. Each of the trench capacitors includes a second electrode present on or within the sidewalls of the trench in which the trench capacitor is present, a first electrode present within the trench, and a node dielectric separating the first electrode from the second electrode. A first transistor that is present in the memory region is in electrical communication with the first electrode of the at least one trench capacitor that is also present in the memory region. A second transistor that is present in the logic region is physically separated from the trench capacitors that are present within the logic region by an insulating material. Contacts are present in electrical communication with the second electrode of the trench capacitor in the memory region and are present to the first and second electrodes of the trench capacitor that is present in the logic region.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In one embodiment, the present invention relates to a method and structure for forming on-chip capacitors, e.g., decoupling capacitor, and memory devices, e.g., eDRAM devices, on the same semiconductor-on-insulator (SOI) substrate. The method disclosed herein provides capacitors, logic devices, and memory devices on a single SOI substrate using a method that produces the capacitors, logic devices and memory devices independent of the pattern density of the trenches in which the capacitors are present. In one embodiment, trench capacitors are placed not only in the memory and logic regions of the SOI substrate, but also in the isolation regions, e.g., shallow trench isolation (STI) regions, that are present between the memory and logic regions. By integrating trench capacitors in the isolation regions, as well as the logic and memory regions, the process flow described herein increases trench pattern density. Further, the method disclosed herein allows for the same method steps that provide the trench structures, e.g., trench capacitors, in a first region, such as a memory region, of the SOI substrate to be the same as the method steps that provide the trench structures, e.g., trench structures, in a second region, such as a logic region. Therefore, the method disclosed herein provides for commonality of the trench processing for each region of the SOI substrate. When describing the following structures and methods, the following terms have the following meanings, unless otherwise indicated.

As used herein, the term "memory device" means a structure in which the electrical state thereof can be altered and then retained in the altered state; in this way a bit of information can be stored.

A "capacitor" is a structure including two electrically conductive materials separated and insulated from each other by a dielectric for storing a charge.

The term "electrode" as used to describe a component of the capacitor represents one of at least two electrically conductive materials of the capacitor that are separated by the node dielectric layer.

A "node dielectric layer" is the dielectric layer that is present between the electrodes of the capacitor.

A "logic device" is an electrical device that can be switched from a conductive state to a non-conductive state, in which the change in current can be correlated to instructions in a binary language.

As used herein a "field effect transistor" is a semiconductor device in which output current, i.e., source-drain current, is controlled by the voltage applied to the gate. A field effect transistor has three terminals, i.e., gate, source and drain.

A "gate structure" means a structure used to control output current (i.e., flow of carriers in the channel) of a semiconducting device through electrical or magnetic fields.

As used herein, a "gate dielectric" is a layer of an insulator between the semiconductor device substrate and the gate conductor.

A "gate conductor" means a conductive structure of the gate structure on the gate dielectric.

As used herein, the term "channel" is the region underlying the gate structure and between the source and drain of a semiconductor device that becomes conductive when the semiconductor device is turned on.

As used herein, the term "drain" means a doped region in semiconductor device located at the end of the channel, in which carriers are flowing out of the transistor through the drain.

As used herein, the term "source" is a doped region in the semiconductor device, in which majority carriers are flowing into the channel.

"Electrically conductive" and/or "electrical communication" as used through the present disclosure means a material having a room temperature conductivity of greater than $10^{-8}$ $(\Omega\text{-m})^{-1}$.

As used herein, "insulating" and "dielectric" denote a material having a room temperature conductivity of less than about $10^{10}$ $(\Omega\text{-m})^{-1}$.

As used herein, the term "conductivity type" denotes a dopant region being p-type or n-type.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure may be present between the first element and the second element.

Figure 1:
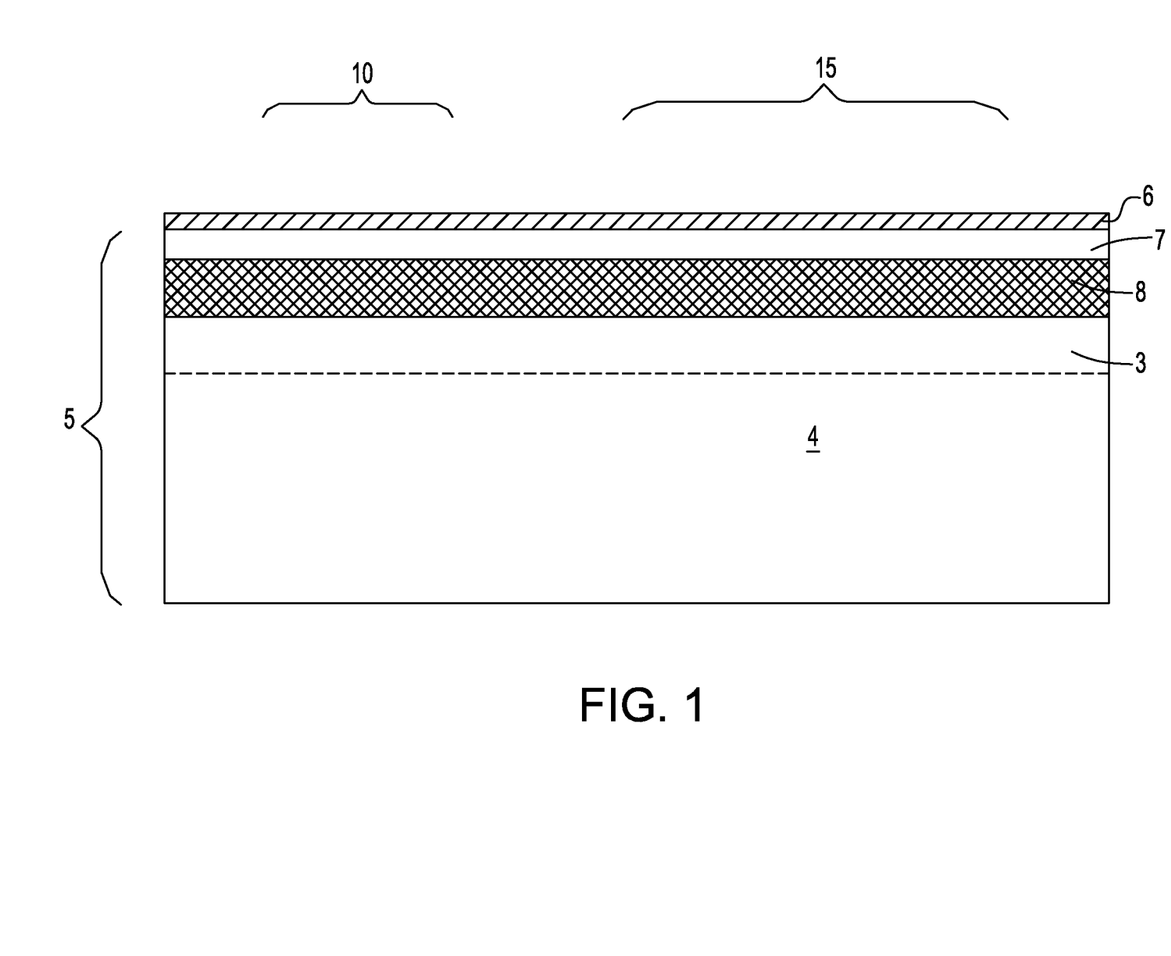
FIG. 1 is a side cross-sectional view depicting a semiconductor-on-insulator (SOI) substrate including a logic region and a memory region, in accordance with one embodiment of the present invention.

FIG. 1 depicts one embodiment of a semiconductor-on-insulator (SOI) substrate 5, which may be used in accordance with present the invention. In one example, at least one dielectric layer, e.g., pad dielectric stack 6, is present on an upper surface of the SOI substrate 5.

In the example depicted in FIG. 1, the SOI substrate 5 includes a first semiconductor layer 7 (also referred to as a semiconductor-on-insulator (SOI) layer or an upper semiconductor layer), such as a silicon-containing semiconductor layer, located on a surface of a buried dielectric layer 8, such as a buried oxide layer. The first semiconductor layer 7 typically has a thickness greater than 10 nm. The buried dielectric layer 8 typically has a thickness ranging from 10 nm to 100 nm. In another embodiment, the buried dielectric layer 8 ranges from 20 nm to about 80 nm. Underlying the buried dielectric layer 8 is a lower semiconductor layer, i.e., second semiconductor layer 4, which may be composed of a Si-containing material, and may have a thickness ranging from 10 nm to 500 nm.

The first semiconductor layer 7 and/or the second semiconductor layer 4 may include any semiconductor material including, but not limited to: Si, Ge, SiGe, GaAs, InAs, InP, or other III/IV compounds. In one embodiment the first semiconductor layer 7 is a same semiconductor material as the second semiconductor layer 4. Conversely, and in another embodiment, first semiconductor layer 7 is a different semiconductor material than the second semiconductor layer 4. The first semiconductor layer 7 and/or the second semiconductor layer 4 may be doped with p-type or n-type dopants or may be undoped. In particular, the first semiconductor layer 7 and/or the second semiconductor layer 4 may be lightly doped with p-type dopants, such as boron. In another embodiment, the upper surface of the second semiconductor layer may be doped to provide a band of n-type or p-type conductivity 3. The band of dopant 3 may provide for electrical communication to the subsequently formed trench capacitors. The dopant that provides the band of dopant 3 may be provided by ion implantation, or may be introduced to the second semiconductor layer 4 in an in-situ dopant process during an epitaxial growth process that provides the first semiconductor layer 4. In one embodiment, the band of dopant 3 is composed of n-type dopants, such as arsenic and/or phosphorus, and has a dopant concentration ranging from $5 \times 10^{17}$ atoms/cm$^3$ to $5 \times 10^{20}$ atoms/cm$^3$. In one embodiment, the band of dopant 3 is composed of p-type dopants, such as boron and/or indium, and has a dopant concentration ranging from $5 \times 10^{17}$ atoms/cm$^3$ to $5 \times 10^{20}$ atoms/cm$^3$. Although the band of dopant 3 shown in FIG. 1 is a single electrically connected region across an entire top layer of the semiconductor layer 4, in some embodiments the band of the dopant 3 may be composed of multiple electrically isolated regions to provide further flexibility to contact the different regions in the semiconductor layer 4. Yet in some embodiment, the entire semiconductor layer 4 may be doped with a dopant concentration ranging from $5 \times 10^{16}$ atoms/cm$^3$ to $5 \times 10^{21}$ atoms/cm$^3$. The buried dielectric layer 8 may be any dielectric material, such as an oxide, nitride, oxynitride, high-k dielectric, or any suitable combination of those materials. In one example, the buried dielectric layer 8 is composed of silicon oxide.

The SOI substrate 5 may be formed using a bonding process, or it may be formed using an ion implantation process, such as SIMOX. In one embodiment, the SOI substrate 5 is a bonded substrate comprised of two semiconductor wafers that are bonded together. The two wafers used in fabricating the bonded substrate may include two SOI wafers, wherein one of the wafers includes the first semiconductor layer 7. One of the two wafers includes a dielectric layer present thereon, which is to be positioned between the first semiconductor layer 7 and the second semiconductor layer 4 to provide the buried dielectric layer 8 of the semiconductor (SOI) substrate. Bonding is achieved by first bringing the two wafers into intimate contact with other; optionally applying an external force to the contacted wafers; and then heating the two contacted wafers under conditions that are capable of bonding the two wafers together. The heating step may be performed in the presence or absence of an external force. In one embodiment, the heating step is typically performed in an inert ambient at a temperature of from 600° C. to 1300° C. for a time period of from 2 hours to 20 hours.

In one embodiment, the SOI substrate 5 includes a memory region 10 and a logic region 15. The memory region 10 provides the location of the subsequently formed memory devices, such as embedded dynamic random access memory (eDRAM) devices. The logic region 15 provides the location of the subsequently formed logic devices, such as field effect transistors (FETs), and bipolar transistors (BJTs), etc.

The pad dielectric stack 6 includes at least one dielectric layer. The pad dielectric stack 6 may be formed on the surface of the SOI substrate 5 using deposition and/or thermal growth processes. In one embodiment, the pad dielectric stack 6 serves as an etch mask during formation of at least one trench in the SOI substrate 5. The pad dielectric stack 6 may comprise a single pad dielectric layer, or the pad dielectric stack 6 may comprise a multi-layered structure. For example, the pad dielectric stack 6 may comprise an oxide, a nitride, or a doped silicate glass material, or two or more of the aforementioned materials may be employed.

In the example depicted in FIG. 1, the pad dielectric stack 6 includes a single pad dielectric layer. In one embodiment, the single pad dielectric layer is selected from the group consisting of a pad oxide layer and a pad nitride layer. When the single pad dielectric layer is composed of a pad oxide layer, the pad oxide layer may be silicon oxide having a thickness ranging from 1 nm to 10 nm, typically being 5 nm. In one embodiment, the single pad dielectric layer is a thermally grown oxide. When the single pad dielectric layer is composed of a pad nitride layer, the pad nitride layer may be silicon nitride having a thickness ranging from 10 nm to 100 nm.

Figure 2:
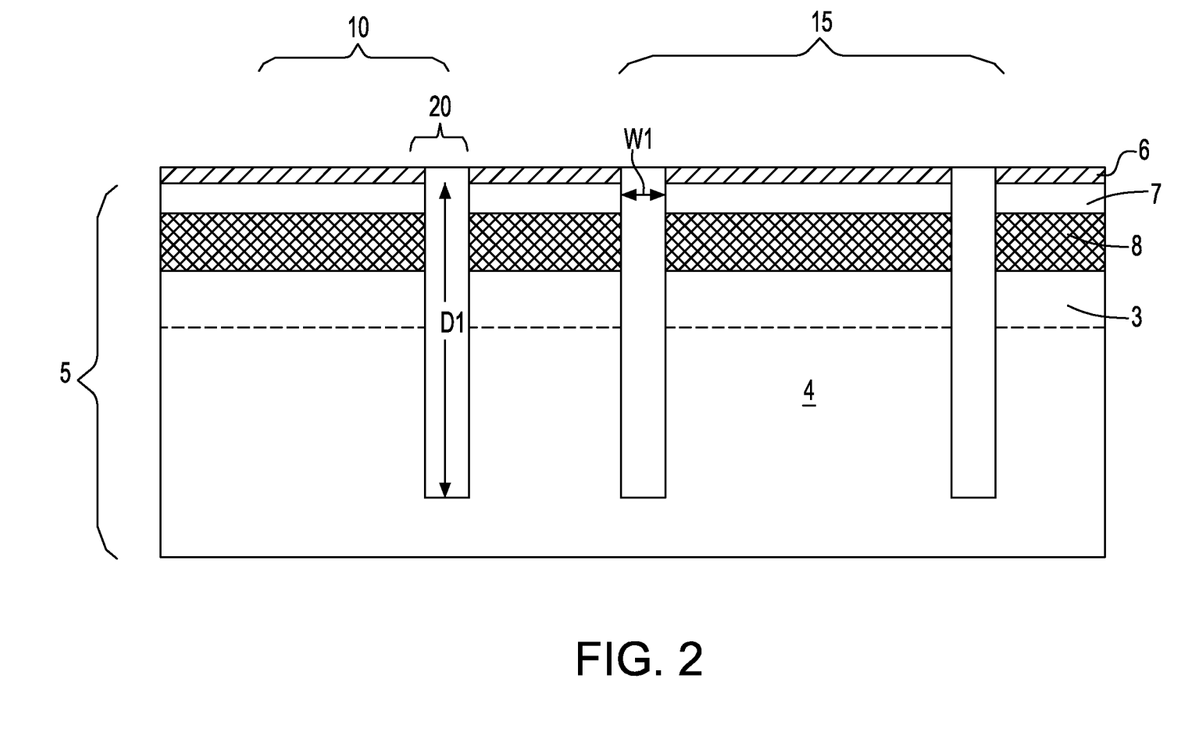
FIG. 2 is a side cross-sectional view depicting one embodiment of forming trenches in each of the logic region and the memory region, in which each of the trenches extend from a surface of the first semiconductor layer through the insulating layer into the second semiconductor layer, in accordance with the present invention.

FIG. 2 depicts one embodiment of forming trenches 20 in each of the logic region 10 and the memory region 15, in which each of the trenches 20 extends from an upper surface of the first semiconductor layer 7 through the buried dielectric layer 8 into the second semiconductor layer 4. In one embodiment, following the formation of the pad dielectric stack 6 on the surface of the SOI substrate 5, the pad dielectric stack 6 is patterned using lithography and etching. A photolithographic mask (not shown) is produced, by applying a photoresist layer (not shown) on the exposed surface to be etched utilizing a deposition process. The photoresist layer is then patterned utilizing lithography so as to expose selective regions of the pad dielectric stack 6 in which trenches 20 are to be formed. The lithography step employed in the present invention includes exposing the photoresist to radiation to form a pattern in the photoresist and developing the pattern. The pattern (not shown) is then transferred into the layer of the pad dielectric stack 6 using an etching process, such as reactive-ion etching (RIE), ion beam etching, plasma etching or laser ablation that is highly selective in removing pad material as compared to photoresist. In one embodiment, a hardmask (not shown) is deposited on the pad layer 6 before performing the lithography process. The pattern in the photoresist layer is first transferred to the underlying hardmask layer. The hardmask layer is then used to further transfer the pattern into the pad layer 6, the first semiconductor layer 7, the buried insulator layer 8, and the second semiconductor layer 4 to form trenches 20.

An opening is etched through the pad dielectric stack 6, the first semiconductor layer 7, the buried dielectric layer 8 and the second semiconductor layer 4 to provide the trenches 20. In one embodiment, the opening is first formed in the pad dielectric stack 6 to expose a portion, i.e., exposed portion, of the SOI substrate 5. Thereafter, the exposed portion of the SOI substrate 5 is etched to provide a trench 20 extending through the first semiconductor layer 7, the buried dielectric layer 8, and into the second semiconductor layer 4.

The opening in the pad dielectric stack 6 may be formed using an etch process, such as an anisotropic etch process. An "anisotropic etch process" is a material removal process in which the etch rate in the direction normal to the surface to be etched is much higher than in the direction parallel to the surface to be etched. Etching of the at least one opening into the first semiconductor layer 7 of the SOI substrate 5 may be performed using a timed anisotropic etch process step that is highly selective in removing the material of the first semiconductor layer 7 of SOI substrate 5 as opposed to the material of the pad dielectric stack 6 or masking layer when present. Dry etching processes that may be used to form the trenches 20 include, but are not limited to: RIE, ion-beam etching, plasma etching or any other like dry etch process. A combination of the aforementioned dry etch processes may also be used in providing the at least one trench 20.

In one embodiment, a first etch chemistry may remove the first semiconductor layer 7 selective to the buried dielectric layer 8, wherein a second etch chemistry may remove the buried dielectric layer 8 selective to the second semiconductor layer 4. Thereafter, the second semiconductor layer 4 is then etched using a timed etch process to determine the trench's 20 depth.

In one embodiment of the present invention, the final depth $D_1$ of each trench 20, as measured from the top surface of the first semiconductor layer 7 is as great as 10 μm. The final depth $D_1$ of the trench 20, as measured from the top surface of the first semiconductor layer 7 of the SOI substrate 5, may range from 4 μm to 10 μm. In one example, the width $W_1$ of the trench 20 may range from 30 nm to 300 nm. In another example, the width $W_1$ of the trench 20 may range from 50 nm to 120 nm. The aspect ratio (height to width ratio) of the trench 20 may range from 5:1 to 100:1. Even more typically, the aspect ratio ranges from 20:1 to 50:1.

Figure 3:
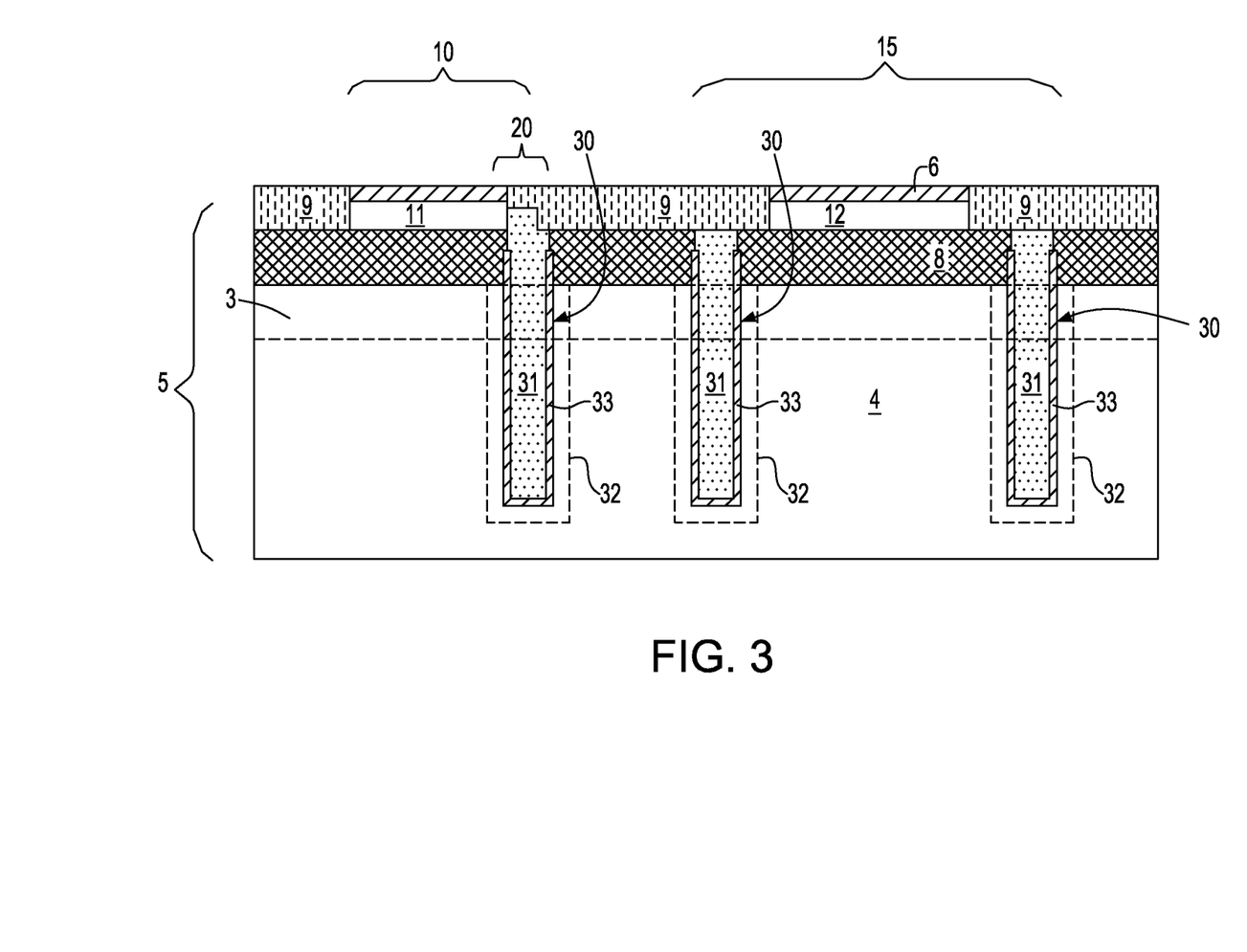
FIG. 3 is a side cross-sectional view depicting one embodiment of forming trench capacitors in each of the logic region and the memory region, wherein each of the trench capacitors are produced using a same process, and each of the trench capacitors includes a first and second electrode separated by a node dielectric, in accordance with the present invention.

FIG. 3 depicts one embodiment of forming trench capacitors 30 in the logic region 15 and the memory region 10. Each of the trench capacitors 30 is produced using a same process, and each of the trench capacitors 30 includes a first and second electrode 31, 32 separated by a node dielectric 33. The term "same process" as used to describe the method of forming the trench capacitors 30 means that the process sequence, which includes but is not limited to, the formation of trench 20, the first electrode 31, the node dielectric 33, and the second electrode 32, is the same for the trench capacitors 30 in the memory region 10 as the trench capacitors 30 in the logic region 15. In this manner, commonality of the trench capacitors 30 is provided for the memory region 10 and the logic region 15. Commonality of the trench capacitors 30 reduces process complexity and cost. By forming the trench capacitors 30 for the memory region 10 and the logic region 15 using the same process, the trench capacitors 30 in the memory region 10 are structurally identical to the trench capacitors 30 in the logic region 15. The term "structurally identical" means that the composition of the first electrode 31, node dielectric 33, and the second electrode 32, is the same for the trench capacitors 30 in the memory region 10 as the trench capacitors 30 in the logic region 15.

In one embodiment, the second electrode 32, i.e., lower electrode, of the trench capacitors 30 may be formed in the sidewalls of the trench 20 via ion implantation of n-type or p-type dopants into the second semiconductor layer 4 of the SOI substrate 5 to provide a buried plate diffusion region. In one example, the second electrode 32 may be provided by an N+ buried plate diffusion region that is formed about, i.e., within, the exterior walls of the at least one trench 20 using a process that is capable of diffusing N+ dopant through the trench walls. Producing the N+ buried plate diffusion region may begin with introducing a dopant source to the sidewalls of the at least one trench 20 and then thermally diffusing the dopant into the second semiconductor layer 4 of the SOI substrate 5.

In one embodiment, the dopant source to produce the N+ buried plate diffusion region may be introduced by ion-implanting an impurity, such as arsenic (As) or phosphorus (P), into the sidewall of the trench 20. Arsenic (As) may be ion-injected into the trench 20 under the conditions of an accelerating voltage, of about 40 kV, and at a dose of about $10^{15}/cm^2$. Depositing a layer of N-type doped material, such as arsenic doped silicate glass, may also form the N+ buried plate diffusion region. After the impurities are introduced to the sidewalls of the at least one trench 20, the SOI substrate 5 including the second semiconductor layer 4 is heated in a nitrogen atmosphere at a temperature of about 900° C. for about 30 minutes, thereby diffusing N-type dopants into the second semiconductor layer 4 and forming a N-type impurity buried plate diffusion region around the sidewalls of the trench 20.

In another embodiment, a gaseous doping source such as $AsH_3$ or plasma doping source may also be used to dope the sidewall of the trench 20 in the second semiconductor layer 4 of the SOI substrate 5 to provide the second electrode 32.

In yet another embodiment, the second electrode 32 is provided on the sidewall and base of trench 20 by a conformally deposited metal nitride layer. This embodiment is not particularly shown in the drawings of the instant application. The conformally deposited metal nitride layer may be composed of titanium nitride (TiN), tantalum nitride (TaN), tantalum silicon nitride (TaSiN), tungsten nitride (WN) or a combination thereof. The width of the conformally deposited metal nitride layer that provides the second electrode 32 may range from 3 nm to 30 nm, as measured from the sidewall of the at least one trench 20. More typically, the width of the conformally deposited metal nitride layer that provides the second electrode 32 may have a thickness of about 10 nm.

The conformally deposited metal nitride layer for the second electrode 32 may be provided using chemical vapor deposition (CVD). As used herein, a "conformally deposited" layer is a deposited material having a thickness that remains the same regardless of the geometry of underlying features on which the layer is deposited, wherein the thickness of the layer does not deviate from greater than or less than 20% of an average value for the thickness of the layer. Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes suitable for providing the conformally deposited metal nitride layer of the second electrode 32 include, but are not limited to: Atmospheric Pressure CVD (APCVD), Low Pressure CVD (LPCVD), Plasma Enhanced CVD (EPCVD), Metal-Organic CVD (MOCVD), and combinations thereof. In another embodiment, the conformally deposited metal nitride layer for the second electrode 32 is provided by atomic layer deposition (ALD). Atomic layer deposition (ALD) is a self-limiting, sequential surface chemistry deposition method that deposits conformal thin-films of materials. Atomic layer deposition (ALD) is similar in chemistry to chemical vapor deposition (CVD), except that the ALD reaction may break the CVD reaction into two half reactions, keeping the precursor materials separate during the reaction.

In another embodiment, the dopant source to provide the second electrode 32 is arsenic or phosphorous doped silicon dioxide glass, or arsenic or phosphorous doped polycrystalline silicon that is deposited along the trench sidewalls. The dopant is driven-in to form an n+ doping region into the second semiconductor layer 4 around the trench 20 from the arsenic doped silicon dioxide glass. The width of the second electrode 32 may range from 25 nm to 100 nm, as measured from the sidewall of the trench 20. In one example, the width of the second electrode 32 has a thickness of about 50 nm, as measured from the sidewall of the trench 20.

In one embodiment, a conformal dielectric layer is formed on the second electrode 32 to provide the node dielectric 33 of the trench capacitor 30 that is formed within the trench 20. The conformal dielectric layer employed at this stage may be any dielectric material including, but not limited to silicon nitride, silicon oxide, aluminum oxide, zirconium oxide, and hafnium oxide. In one embodiment, the conformal dielectric layer that provides the node dielectric 33 may have a thickness of from 4.0 nm to 10.0 nm. In another embodiment, the conformal dielectric layer of the node dielectric 33 may have a thickness of from 2.5 nm to 7.0 nm, with a thickness of from 3.0 nm to 5.0 nm being more typical.

The node dielectric 33 is conformally deposited on the sidewalls and base of the trench 20 or directly on the deposited layer that provides the second electrode 32. In one embodiment, the node dielectric 33 may be deposited using chemical vapor deposition (CVD) and/or atomic layer deposition (ALD). In another embodiment, the node dielectric 33 is formed using a growth process, such as thermal oxidation.

The first electrode 31 is formed atop the node dielectric 33. The first electrode 31 is composed of at least one conductive material, such as doped polysilicon, a metal, or a conductive metallic compound. In one embodiment, the conductive material of the first electrode 31 may be comprised of doped polysilicon, doped amorphous silicon, doped silicon germanium, titanium nitride (TiN), tantalum nitride (TaN), tantalum silicon nitride (TaSiN), tungsten nitride (WN) or a combination thereof. In the embodiments in which the conductive material is provided by doped polysilicon, the dopant may be an n-type or p-type dopant having a dopant concentration ranging from $1 \times 10^{18}$ atoms/cm$^3$ to $1 \times 10^{21}$ atoms/cm$^3$. The conductive material for the first electrode 31 may be deposited using physical vapor deposition (PVD), such as plating or sputtering, or may be deposited using chemical vapor deposition (CVD). The first electrode 31 may be deposited to fill the trench 20.

FIG. 3 further depicts forming isolation regions 9 in the first semiconductor layer of the SOI substrate 5. The positioning of the isolation regions 9 is selected so that the remaining portion of the first semiconductor layer provides a first semiconductor island 11 that is positioned in the memory region 10 of the SOI substrate 5, and to provide a second semiconductor island 12 that is positioned in the logic region 15 of the SOI substrate 5. In one embodiment, the isolation regions 9 formed in the memory region 10 are positioned to provide at least one first semiconductor island 11 that is in direct contact with the first electrode 31 of at least one trench capacitor 30 in the memory region 10, and the isolation regions 9 formed in the logic region 15 provide at least one second semiconductor island 12 that is separated from the trench capacitors 30. In one embodiment, the isolation regions 9 that are separate the second semiconductor island 12 from the trench capacitors 30 that are present in the logic region 15, electrically insulates the logic devices, such as transistors, e.g., field effect transistors, from the trench capacitors 30 that are present in the logic region 15 of the SOI substrate 5.

In one embodiment, the isolation regions 9 electrically isolate the first semiconductor island 11 from the second semiconductor island 12. An isolation region, such as a trench top oxide (TTO), may be formed overlying each of the trench capacitors 30. Forming the isolation region 9 may include an etch process to remove a portion of the first semiconductor layer, deposition of an insulating material, such as an oxide, nitride, and/or oxynitride material, and planarization process, such as chemically mechanical polishing (CMP). It is noted that in addition to the isolation region 9 that is present overlying the trench capacitors 30 other isolation regions may simultaneously be formed through the first semiconductor layer.

Figure 4:
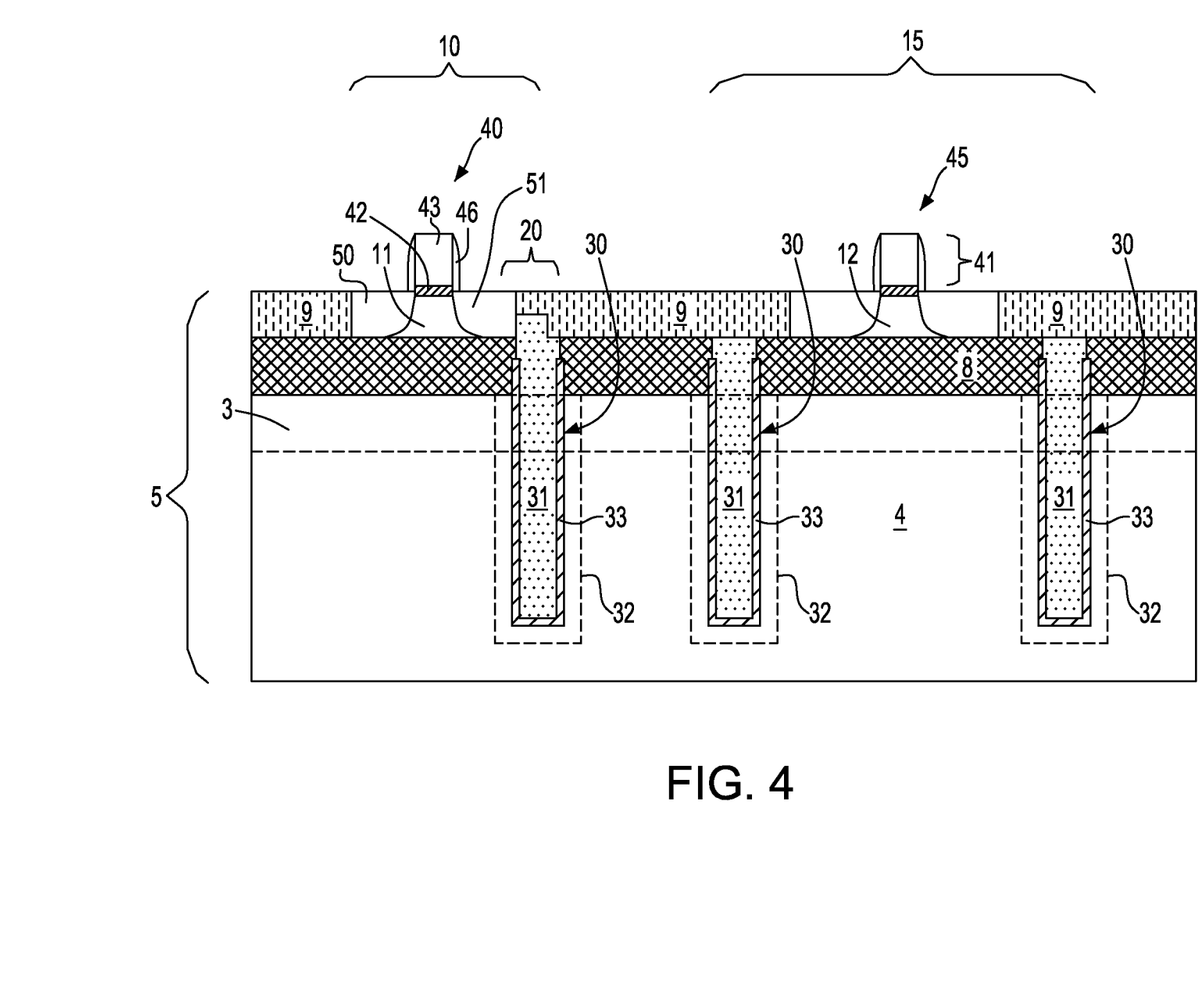
FIG. 4 is a side cross-sectional view depicting forming a first transistor on at least one first semiconductor island and a second transistor on at least one second semiconductor island, wherein the first transistor is in electrical communication with the trench capacitor having a first electrode that is in contact with the first semiconductor island, in accordance with one embodiment of the present invention.

FIG. 4 depicts forming a first transistor 40 on at least one of the first semiconductor islands 11 and a second transistor 45 on at least one second semiconductor island 12, wherein the first transistor 40 is in electrical communication with at least one trench capacitor 30 having a first electrode 31 that is in contact with the first semiconductor island 11. In one embodiment, forming the first and second transistors 40, 45 include forming a gate structure 41 including at least one gate dielectric 42 and at least one gate conductor 43 on the at least one first semiconductor island 11 and the at least one second semiconductor island 12. Following the formation of the gate structure 41, source and drain regions 42 may be formed in the first semiconductor island 11 and the second semiconductor island 12 adjacent to the portion of the SOI substrate 5 on which the gate structure 41 is present.

In one embodiment, a gate structure 41 is formed directly on the remaining portion of the first semiconductor layer that provides the first semiconductor island 11 and the second semiconductor island 12. The gate structure 41 can be formed using deposition, photolithography and a selective etching process. Specifically, a pattern is produced by applying a photoresist to the surface to be etched; exposing the photoresist to a pattern of radiation; and then developing the pattern into the photoresist utilizing a resist developer. Once the patterning of the photoresist is completed, the sections covered by the photoresist are protected while the exposed regions are removed using a selective etching process that removes the unprotected regions. In one embodiment, a hard mask (not shown) may be used to form the gate structure 41. The dielectric cap may be formed by first depositing a dielectric hard mask material, like SiN or $SiO_2$, atop a layer of gate electrode material and then applying a photoresist pattern to the hard mask material using a lithography process steps. The photoresist pattern is then transferred into the hard mask material using a dry etch process forming the dielectric cap. Next the photoresist pattern is removed and the dielectric cap pattern is then transferred into the gate electrode material during a selective etching process. The dielectric cap may be removed by a wet or dry etch prior to the silicidation process. In some embodiments, a replacement gate process can be used to form each of the gate structures.

Each of the gate structures 41 may include at least a gate conductor 43 atop a gate dielectric 42. Gate conductor 43 may be a metal gate electrode. The metal gate electrode may be any conductive metal including, but not limited to W, Ni, Ti, Mo, Ta, Cu, Pt, Ag, Au, Ru, Ir, Rh, and Re, and alloys that include at least one of the aforementioned conductive elemental metals. In another embodiment, the gate conductor 43 may be a doped semiconductor material, such as a doped silicon containing material, e.g., doped polysilicon. When a combination of conductive elements is employed, an optional diffusion barrier material such as TaN or WN may be formed between the conductive materials. The gate conductor 43 of the gate structure 41 is typically present on a gate dielectric 42. The gate dielectric 42 may be a dielectric material, such as $SiO_2$, or alternatively high-k dielectrics, such as oxides of Ta, Zr, Al or combinations thereof. In another embodiment, the gate dielectric 42 is comprised of an oxide, such as $SiO_2$, $ZrO_2$, $Ta_2O_5$ or $Al_2O_3$. In one embodiment, the gate dielectric 42 has a thickness ranging from 1 nm to 10 nm. In another embodiment, the gate dielectric 42 has a thickness ranging from 1.5 nm to 2.5 nm.

Spacers 46 can be formed in direct contact with the sidewalls of the gate structure 41. The spacers 46 typically have a width ranging from 2.0 nm to 15.0 nm. The spacers 46 can be formed using deposition and etch processing steps. The spacers 46 may be composed of a dielectric, such as nitride, oxide, oxynitride, or a combination thereof.

Source regions 50 and drain regions 51 are formed by implanting p-type and/or n-type dopants into at least one of the first semiconductor island 11 and the second semiconductor island 12 in the portion of the SOI substrate 5 that is adjacent to the gate structure 41. In one embodiment, the source and drain regions 50, 51 are implanted with an n-type dopant, in which the conductivity of the transistor being formed is an n-type conductivity field effect transistor (nFET). In one embodiment, n-type FET devices are produced by doping the first semiconductor island 11 and/or the second semiconductor island 12 with elements from group V of the Periodic Table of Elements. In one embodiment, the group V element is phosphorus, antimony or arsenic. In one embodiment, the source and drain regions 50, 51 are implanted with an p-type dopant, in which the conductivity of the transistor being formed is a p-type conductivity field effect transistor (nFET). P-type FET devices are produced by doping the first semiconductor island 11 and/or the second semiconductor island 12 with elements from group III of the Periodic Table of Elements. In one embodiment, the group III element is boron, aluminum, gallium or indium. In one embodiment, the source and drain regions 50, 51 that are present in the first semiconductor island 11 may be of a different conductivity as the source and drain regions 50, 51 that are present in the second semiconductor island 12. Selectivity of the doping process may be provided using implant masks, such a photoresist ion implantation masks. Further, when multiple transistors are present of each of the first and second semiconductor island 11, 12, each of the transistors may have a different conductivity by employing ion implantation masks and ion implantation processes to implant dopants of different conductivities.

The source and drain regions 50, 51 may be doped using ion implantation. Resulting dopant concentrations for the source and drain regions 50, 51 may range from $1 \times 10^{18}$ dopant atoms per cubic centimeter to $1 \times 10^{21}$ dopant atoms per cubic centimeter. The source and drain regions 50, 51 may further include extension regions and/or halo implant regions. The implants to provide the extension regions and the halo implant regions may include a combination of normally incident and angled implants to form the desired grading and implant depth.

In one embodiment, the drain region 51 of the first transistor 40 that is present on the first semiconductor island 11 is in electrical communication with the first electrode 31 of the trench capacitor 30 through the first transistor's 40 drain region 51. In one example, the first transistor 40 and the trench capacitor 30 that are in electrical communication provide an embedded dynamic random access memory (EDRAM) device.

Figure 5:
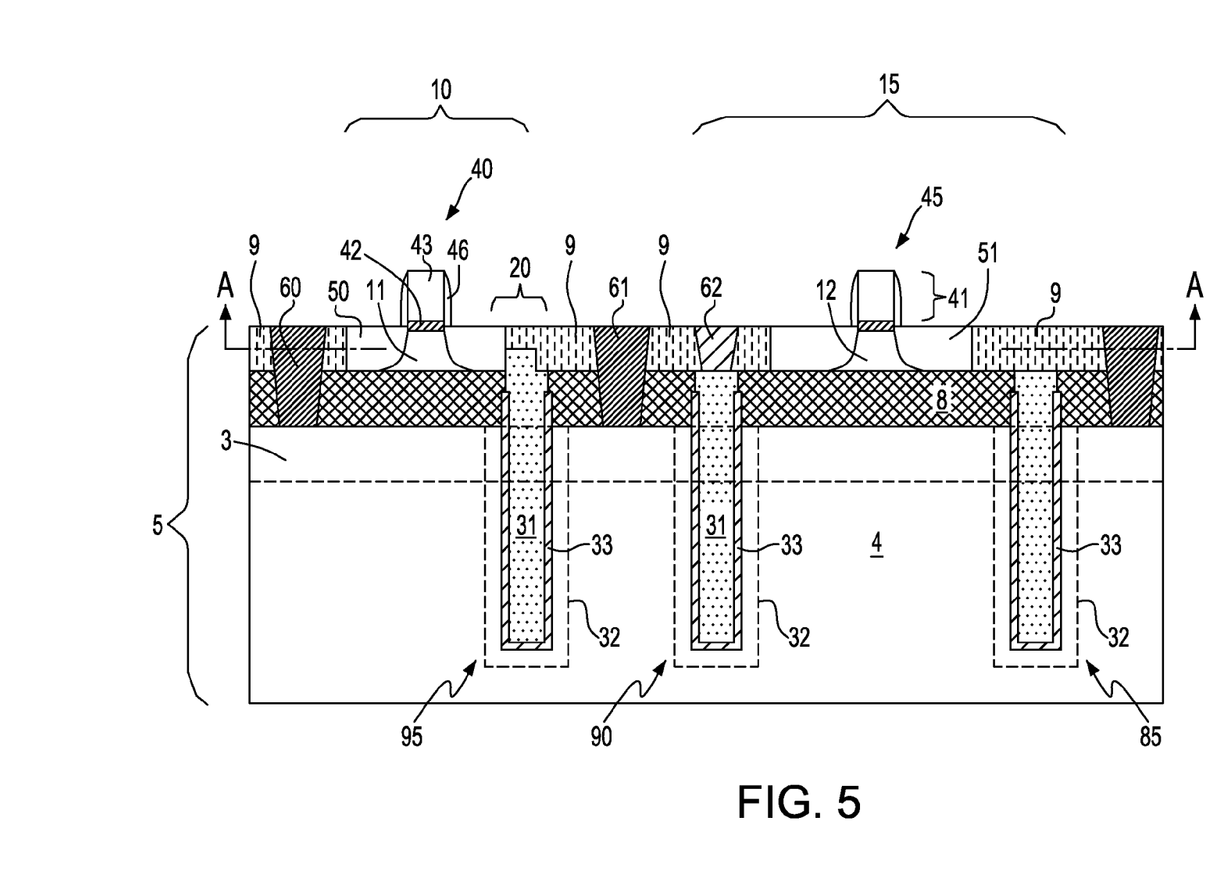
FIG. 5 is a side cross-sectional view depicting forming contacts to the second electrode of at least one trench capacitor in the memory region, and to the first and the second electrode of at least one trench capacitors in the logic region, in accordance with one embodiment of the present invention.

FIG. 5 depicts forming a contact 60 to the second electrode 32 of the at least one trench capacitor 95 in the memory region 10, and forming contacts 61, 62 to the first and the second electrode 31, 32 of at least one of the trench capacitors 90 that are present in the logic region 15. It is noted that the trench capacitors that were previously collectively indicated in FIGS. 3 and 4 by reference number 30 are now individually referred to as inactive capacitor 85, decoupling capacitor 90, and memory capacitor 95. In some embodiments, the band of dopant 3 is composed of electrically isolated bands and the contacts 60, 61 may electrically contact the different bands. In one embodiment, the trench capacitors that are present in the logic region 15 and have a contact 61, 62 to both the first electrode 31 and the second electrode 32 are decoupling capacitors 90. Decoupling capacitors 90 having a large capacitance have become increasingly relevant in high frequency integrated circuits to suppress a voltage fluctuation in power supply networks during high speed switching operations. In one example, a first decoupling contact 61 extends through an isolation region 9 to the second semiconductor layer 4 and provides electrical connectivity to the second electrode 32 of a decoupling capacitor 90 through the n-type conductivity band 3, and a second decoupling contact 61 extends through the isolation region 9 into direct contact with the first electrode 31. In one example, in the memory region 10 of the SOI substrate 5, a contact 60 is formed through an isolation region 9 to the second semiconductor layer 4 and provides electrical connectivity through the n-type conductivity band 3 to the second electrode 32 of the trench capacitor, i.e., memory capacitor 95, to the memory device, i.e., eDRAM. In some embodiments, at least one of the trench capacitors in the logic region 15 and/or memory region 10 is an inactive trench capacitor 85. By "inactive" it is meant that there is no electrical connectivity to at least one of the first and second electrodes 31, 32 of the trench capacitor 85. In one example, an inactive trench capacitor 85 that is present in the logic region 15 includes an isolation region 9 present atop the first electrode 31 without any conductive features being formed through the isolation region 9, hence there is no electrical contact to the first electrode 31. It is found that in some examples it is may be challenging to form trench capacitors with a very low trench pattern density, because the low trench pattern density leads to narrow process window and low product yield. The presence of the inactive trench capacitor 85 helps increase the trench pattern density across the wafer and thus facilitate the formation of the trench capacitor 95 in memory region 10 and the trench capacitor 90 in the logic region 15 by a common process.

To form the contacts 60, 61, 62, in some embodiments of the invention, the isolation regions 9 are patterned and etched to form via holes to expose either the second semiconductor layer 4 in which the n-type conductivity band 3 is present and/or the first electrode 31 of the trench capacitors, e.g., decoupling trench capacitors 85. Following via formation contacts 60, 61, 62 are formed by depositing a conductive metal into the via holes using deposition methods, such as CVD or plating. The conductive metal may include, but is not limited to: tungsten, copper, aluminum, silver, gold and alloys thereof.

In one embodiment, the above-described method provides a device that includes an SOI substrate 5 having a memory region 10 and a logic region 15, in which trench capacitors 85, 90, 95 present in each of the memory region 10 and the logic region 15 are structurally identical. The first transistor 40 present in the memory region 10 is in electrical communication with the first electrode 31 of at least one of the trench capacitor, i.e., memory capacitor 95, which is present in the memory region 10. The second transistor 45 that is present in the logic region 15 is physically separated from the trench capacitors 85, 90 that are present within the logic region 15 by insulating material, e.g., isolation regions 9 and buried dielectric layer 8. In one embodiment, a number of inactive trench capacitors 85 may be present in the memory region 10 and/or logic region 15.

Figure 6:
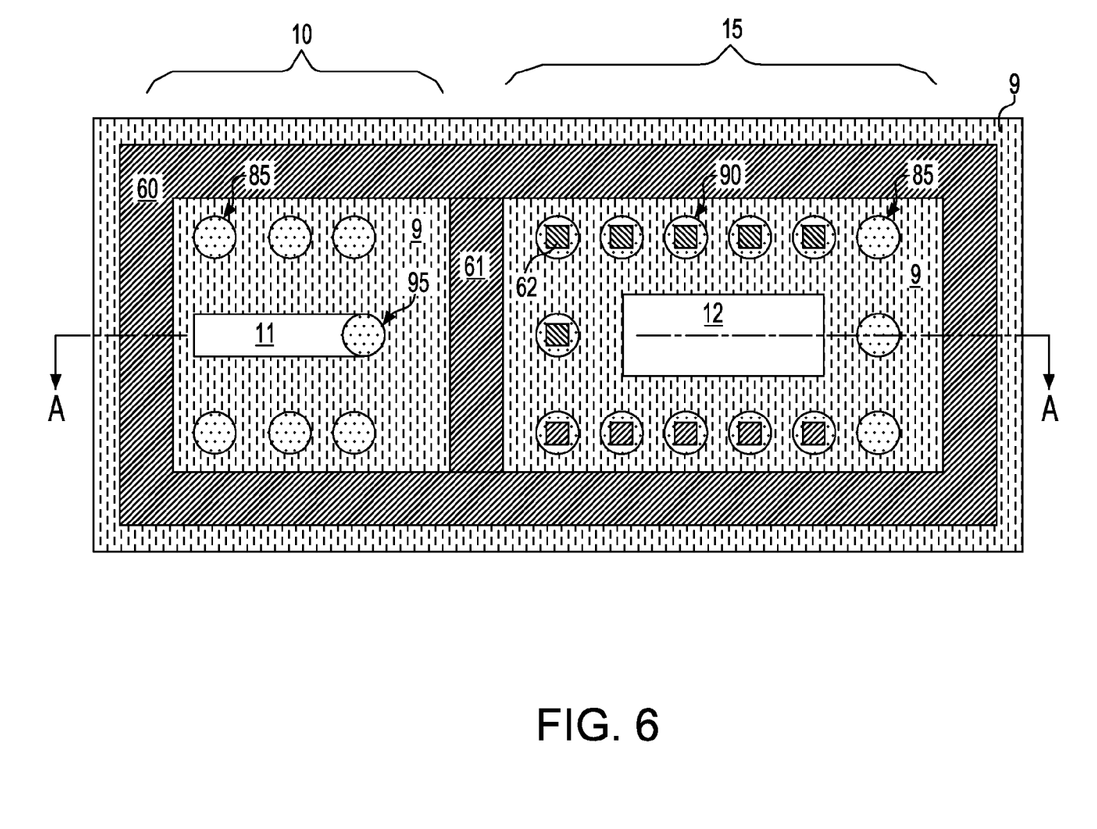
FIG. 6 is a top down cross-sectional view along section line A-A of the structure depicted in FIG. 5.

FIG. 6 depicts a top down view of a device formed on an SOI substrate 5 that includes a memory region 10 having an eDRAM present therein, and a logic region 15 having a logic device 15 present therein. Inactive trench capacitors 85 are present in both the memory region 10 and the logic region 15. The decoupling capacitors 90 that are present in the logic region 15 have a contact 62 to the first electrode 31. The memory capacitor 95 is in direct contact with the first semiconductor island 11.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:
1. A method of fabricating a device comprising:
providing a substrate having a first semiconductor layer that is separated from a second semiconductor layer by an insulating layer present therebetween, in which the substrate includes at memory region and a logic region;

forming trench capacitors in each of the logic region and the memory region, wherein each of the trench capacitors are produced using a same process and extend from a surface of the first semiconductor layer through the insulating layer into the second semiconductor layer, and in which each of the trench capacitors includes a first and second electrode separated by a node dielectric;

forming isolation regions in the first semiconductor layer, in which the isolation regions formed in the memory region are positioned to provide at least one first semiconductor island in contact with the first electrode of at least one of the trench capacitors and the isolation regions formed in the logic region provide at least one second semiconductor island that is separated from the trench capacitors; and forming a first transistor on the at least one first semiconductor island and a second transistor on the at least one second semiconductor island, wherein the first transistor is in electrical communication with the at least one trench capacitor having the first electrode that is in contact with the first semiconductor island.

2. The method of claim 1 further comprising forming contacts to the second electrode of the at least one trench capacitor in the memory region, and to the first and the second electrode of at least one of the trench capacitors in the logic region.

3. The method of claim 1 further comprising forming at least one of the isolation regions atop an inactive trench capacitor.

4. The method of claim 1, wherein the substrate comprises a semiconductor-on-insulator substrate, in which the first semiconductor layer is present atop an upper surface of the insulating layer, and the insulating layer is present atop an upper surface of the second semiconductor layer.

5. The method of claim 4, wherein the forming of trench capacitors comprises etching a trench extending from an upper surface of the first semiconductor layer through the insulating layer into the second semiconductor layer, forming the second electrode in sidewalls of the trench by ion implantation of n-type or p-type dopants into the sidewalls of the trench, depositing a node dielectric on the sidewalls of the trench, and filling the trench with a semiconductor material doped with n-type or p-type dopants to provide the first electrode.

6. The method of claim 4, wherein the forming of trench capacitors comprises etching a trench extending from an upper surface of the first semiconductor layer through the insulating layer into the second semiconductor layer; depositing the second electrode on the sidewalls of the trench; depositing a node dielectric on the second electrode; and filling the trench with a semiconductor material doped with n-type or p-type dopants to provide the first electrode.

7. The method of claim 4, wherein the forming of the isolation regions in the first semiconductor layer comprises providing an etch mask that exposes the portion of the first semiconductor layer corresponding to the at least one first semiconductor island and to the at least one second semiconductor island; and etching the first semiconductor layer selective to the insulating layer.

8. The method of claim 4, wherein the at least one second semiconductor island is separated from the trench capacitors by a dielectric material.

9. The method of claim 4, wherein the forming of the first transistor and the second transistor comprise forming a gate structure comprising at least one gate dielectric and at least one gate conductor on the at least one first semiconductor island and the at least one second semiconductor island; and implanting source and drain regions in the at least one first semiconductor island and the at least one second semiconductor island adjacent to the gate structure.

10. A method of fabricating a device comprising:
providing a substrate having a first semiconductor layer that is separated from a second semiconductor layer by an insulating layer present therebetween;

forming trench capacitors in a first region and a second region of the substrate, wherein each of the trench capacitors extend from a surface of the first semiconductor layer through the insulating layer into the second semiconductor layer;

forming isolation regions in the first semiconductor layer, in which the isolation regions formed in the first region are positioned to provide at least one first semiconductor island in contact with the first electrode of at least one of the trench capacitors and the isolation regions formed in second region provide at least one second semiconductor island that is separated from the trench capacitors; and forming a first transistor on the at least one first semiconductor island and a second transistor on the at least one second semiconductor island, wherein the first transistor is in electrical communication with the at least one trench capacitor having the first electrode that is in contact with the first semiconductor island.

11. The method of claim 10, wherein each of the trench capacitors includes a first and second electrode separated by a node dielectric.

12. The method of claim 10 further comprising forming contacts to the second electrode of the at least one trench capacitor in the first region, and to the first and the second electrode of at least one of the trench capacitors in the second region.

13. The method of claim 10 further comprising forming at least one of the isolation regions atop an inactive trench capacitor.

14. The method of claim 10, wherein the substrate comprises a semiconductor-on-insulator substrate, in which the first semiconductor layer is present atop an upper surface of the insulating layer, and the insulating layer is present atop an upper surface of the second semiconductor layer.

15. The method of claim 14, wherein the forming of trench capacitors comprises etching a trench extending from an upper surface of the first semiconductor layer through the insulating layer into the second semiconductor layer, forming the second electrode in sidewalls of the trench by ion implantation of n-type or p-type dopants into the sidewalls of the trench, depositing a node dielectric on the sidewalls of the trench, and filling the trench with a semiconductor material doped with n-type or p-type dopants to provide the first electrode.

16. The method of claim 14, wherein the forming of trench capacitors comprises etching a trench extending from an upper surface of the first semiconductor layer through the insulating layer into the second semiconductor layer; depositing the second electrode on the sidewalls of the trench; depositing a node dielectric on the second electrode; and filling the trench with a semiconductor material doped with n-type or p-type dopants to provide the first electrode.

17. The method of claim 14, wherein the forming of the isolation regions in the first semiconductor layer comprises providing an etch mask that exposes the portion of the first semiconductor layer corresponding to the at least one first semiconductor island and to the at least one second semiconductor island; and etching the first semiconductor layer selective to the insulating layer.

18. The method of claim 10, wherein the at least one second semiconductor island is separated from the trench capacitors by a dielectric material.

19. The method of claim 14, wherein the forming of the first transistor and the second transistor comprise forming a gate structure comprising at least one gate dielectric and at least one gate conductor on the at least one first semiconductor island and the at least one second semiconductor island; and implanting source and drain regions in the at least one first semiconductor island and the at least one second semiconductor island adjacent to the gate structure.

20. The method of claim 10, wherein each of the trench capacitors in the first region and the second region of the substrate are structurally identical.

* * * * *